United States Patent
Lamorey et al.

(10) Patent No.: US 7,778,065 B2
(45) Date of Patent: Aug. 17, 2010

(54) METHOD AND APPARATUS FOR IMPLEMENTING CONCURRENT MULTIPLE LEVEL SENSING OPERATION FOR RESISTIVE MEMORY DEVICES

(75) Inventors: Mark C. H. Lamorey, South Burlington, VT (US); Thomas M. Maffitt, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 12/039,990

(22) Filed: Feb. 29, 2008

(65) Prior Publication Data

US 2009/0219749 A1 Sep. 3, 2009

(51) Int. Cl.
 *G11C 11/00* (2006.01)
(52) U.S. Cl. .................. 365/148; 365/207; 365/210.1
(58) Field of Classification Search ................. 365/148, 365/207, 210.1
 See application file for complete search history.

(56) References Cited

U.S. PATENT DOCUMENTS

| | | | |
|---|---|---|---|
| 6,191,989 B1 | 2/2001 | Luk et al. | |
| 6,501,697 B1 | 12/2002 | Perner et al. | |
| 6,567,296 B1 | 5/2003 | Casagrande et al. | |
| 6,600,690 B1 | 7/2003 | Nahas et al. | |
| 6,700,814 B1 | 3/2004 | Nahas et al. | |
| 6,754,123 B2 | 6/2004 | Perner et al. | |
| 6,982,908 B2 | 1/2006 | Cho | |
| 7,099,180 B1 | 8/2006 | Dodge et al. | |
| 7,154,774 B2 | 12/2006 | Bedeschi et al. | |
| 7,161,861 B2 | 1/2007 | Gogl et al. | |
| 7,239,562 B2 | 7/2007 | Takemura | |
| 7,260,004 B2 | 8/2007 | Lamorey et al. | |
| 7,423,476 B2 | 9/2008 | Tang | |
| 2001/0003507 A1 | 6/2001 | Maruyama et al. | |
| 2004/0066690 A1* | 4/2004 | Perner et al. | 365/209 |
| 2005/0068803 A1* | 3/2005 | Rolandi et al. | 365/154 |
| 2005/0259471 A1 | 11/2005 | Kuo | |
| 2005/0281073 A1 | 12/2005 | Cho et al. | |
| 2006/0002172 A1 | 1/2006 | Venkataraman et al. | |
| 2006/0092689 A1 | 5/2006 | Braun et al. | |

(Continued)

OTHER PUBLICATIONS

J. DeBrosse et al.; "A 16Mb MRAM Featuring Bootstrapped Write Drivers;" 2004 Symposium of VLSI Circuits Digest of Technical Papers; IEEE 2004; pp. 454-457.

(Continued)

*Primary Examiner*—Hoai V Ho
(74) *Attorney, Agent, or Firm*—Cantor Colburn LLP; Michael LeStrange (57) ABSTRACT

An apparatus for sensing the data state of a multiple level, programmable resistive memory device includes an active clamping device connected to a data leg that is selectively coupled a programmable resistive memory element, the clamping device configured to clamp a fixed voltage, at a first node of the data leg, across the memory element, thereby establishing a fixed current sinking capability thereof; and a plurality of differential amplifiers, each of the differential amplifiers configured to compare a first voltage input, taken at a second node of the data leg, with a second voltage input; wherein the second voltage input for each differential amplifier comprises different reference voltages with respect to one another so as to enable each differential amplifier to detect a different resistance threshold, thereby determining a specific resistance state of the programmable resistive memory element.

16 Claims, 4 Drawing Sheets

U.S. PATENT DOCUMENTS

| | | |
|---|---|---|
| 2006/0158922 A1 | 7/2006 | Takemura |
| 2006/0221678 A1 | 10/2006 | Bedeschi et al. |
| 2007/0140029 A1 | 6/2007 | Kim et al. |
| 2007/0153569 A1 | 7/2007 | Nirschl et al. |
| 2007/0159869 A1 | 7/2007 | Baek et al. |
| 2008/0192555 A1 | 8/2008 | Fort |
| 2009/0086534 A1* | 4/2009 | DeBrosse et al. ........... 365/163 |
| 2009/0175108 A1* | 7/2009 | Dittrich ................... 365/210.1 |
| 2010/0020595 A1 | 1/2010 | Parkinson et al. |

OTHER PUBLICATIONS

T. W. Andre et al..; "A 4-Mb 0.18μm 1T1MTJ Toggle MRAM with Balanced Three Input Sensing Scheme and Locally Mirrored Unidirectional Write Drivers;" IEEE Journal of Solid-State Circuits, vol. 40, No. 1, Jan. 2005; pp. 301-309.

* cited by examiner

METHOD AND APPARATUS FOR IMPLEMENTING CONCURRENT MULTIPLE LEVEL SENSING OPERATION FOR RESISTIVE MEMORY DEVICES

BACKGROUND

The present invention relates generally to integrated circuit memory devices and, more particularly, to a method and apparatus for implementing concurrent multiple level sensing operation for programmable resistive memory devices.

Dynamic Random Access Memory (DRAM) integrated circuit arrays have been existence for several years, with their dramatic increase in storage capacity having been achieved through advances in semiconductor fabrication technology and circuit design technology. The considerable advances in these two technologies have also resulted in higher and higher levels of integration that permit dramatic reductions in memory array size and cost, as well as increased process yield.

A DRAM memory cell typically includes, as basic components, an access transistor (switch) and a capacitor for storing a binary data bit in the form of a charge. Typically, a first voltage is stored on the capacitor to represent a logic HIGH or binary "1" value (e.g., $V_{DD}$), while a second voltage on the storage capacitor represents a logic LOW or binary "0" value (e.g., ground). A basic drawback of a DRAM device is that the charge on the capacitor eventually leaks away and therefore provisions must be made to "refresh" the capacitor charge, otherwise the data bit stored by the memory cell is lost.

The memory cell of a conventional Static Random Access Memory (SRAM), on the other hand, includes, as basic components, an access transistor or transistors and a memory element in the form of two or more integrated circuit devices interconnected to function as a bistable latch. An example of such a bistable latch is a pair of cross-coupled inverters. Bistable latches do not need to be "refreshed," as in the case of DRAM memory cells, and will reliably store a data bit indefinitely so long as they continue to receive supply voltage. However, such a memory cell requires a larger number of transistors and therefore amount of silicon real estate than a simple DRAM cell, and draws more power than a DRAM cell. Like a DRAM array, an SRAM array is also a form of volatile memory in that the data is lost once power is removed.

Accordingly, efforts continue to identify other types of memory elements that are capable of storing data states, that do not require extensive refreshing, and that are non-volatile in nature. Recent studies have focused on resistive materials that can be programmed to exhibit either high or low stable ohmic states. A programmable resistance element of such material could be programmed (set) to a high resistive state to store, for example, a binary "1" data bit or programmed to a low resistive state to store a binary "0" data bit. The stored data bit could then be retrieved by detecting the magnitude of a readout voltage supplying a current switched through the resistive memory element by an access device, thus indicating the stable resistance state it had previously been programmed to.

Phase Change Random Access Memory ("PCRAM" also referred to as "PRAM") is an emerging non-volatile memory technology which stores data using phase change materials (such as Ge—Sb—Te (GST) alloys) having a programmable electrical resistance that changes with temperature. Other compositions such as $GeSb_4$, (including substitution/addition of other elements) are also possible for the phase change materials. Individual phase change elements (PCE) are thus used as the storage cells of a memory device. The state of an individual PCE is programmed through a heating and cooling process which is electrically controlled by passing a current through the PCE (or a discrete heating element in proximity to the PCE) and the resulting ohmic heating that occurs. Depending upon the specific applied temperature and duration of heating applied to the PCE element, the structure is either "set" to a lower resistance crystalline state or "reset" to an amorphous, higher resistance state. With existing PCE materials, a PCE element may be programmed from the crystalline state to the amorphous state and vice versa on the order of about $10^7$ cycles.

The changing of the phase of a PCE typically requires a high temperature (e.g., above 200 to 900° C. depending on material properties), as can be obtained by Joule heating from current flowing through the phase change material or discrete resistor. When the phase change material is heated above its melting temperature to thereafter be quickly cooled, the phase change material becomes amorphous to store a data bit of "1." Alternatively, when the phase change material is heated above its crystallization temperature and maintained at that temperature for a predetermined time before cooling, the phase change material becomes crystalline to store a data bit of "0."

Data is read from a given PCRAM cell by selecting a bit line and a word line for that cell, passing a current through that PCRAM cell, and thereafter distinguishing a "1" from "0" based upon the voltage generated from the variable resistance of the phase change material of the PCRAM cell. In addition to single-bit memory cells based on resistance values, resistive memory such as PCRAM can accommodate a higher density by storing multiple bits of data therein. More specifically, multi-bit storage in a PCRAM cell may be achieved by programming the PCM to have intermediate resistance values or states. For example, if a PCRAM cell is programmed to one of three different resistance levels, 1.5 bits of data per cell may be stored. Further, if the PCRAM cell is programmed to one of four different resistance levels, then two bits of data per cell can be stored, and so on. Thus, in principle, it is possible to store three or more states by controlling the amount of crystalline material coexisting with amorphous material so as to set the PCRAM cell to an intermediate resistance value.

However, with respect to sensing the state of a multi-bit memory element and decoding the same into a binary result is a challenge. For example, the various resistive memory technologies have temperature and noise dependencies that can shift the resistive state of a logical '1' under certain write/read conditions very close to the resistive state of a logical '0' under different conditions. This problem is further compounded whenever such resistive technologies try to store more than one bit in a cell (e.g., 2 bits per 1 cell, defined by four resistive states). Existing techniques for sensing multiple states utilize multiple sensing iterations, and adjust to noise and temperature variations through compensation. Accordingly, it would be desirable to be able to implement an improved sensing technique for such multi-bit resistive memory devices.

SUMMARY

The foregoing discussed drawbacks and deficiencies of the prior art are overcome or alleviated, in an exemplary embodiment, by an apparatus for sensing the data state of a multiple level, programmable resistive memory device, including an active clamping device connected to a data leg that is selectively coupled a programmable resistive memory element, the active clamping device configured to clamp a fixed voltage, at a first node of the data leg, across the programmable resistive memory element, thereby establishing a fixed current sinking capability thereof; and a plurality of differential amplifiers, each of the plurality of differential amplifiers configured to compare a first voltage input, taken at a second node of the data leg, with a second voltage input; wherein the second voltage input for each differential amplifier comprises different reference voltages with respect to one another so as to enable each differential amplifier to detect a different resistance threshold, thereby determining a specific resistance state of the programmable resistive memory element.

In another embodiment, a method of sensing the data state of a multiple level, programmable resistive memory device includes clamping, with an active clamping device, a fixed voltage at a first node of a data leg that is selectively coupled to a programmable resistive memory element, the active clamping device thereby establishing a fixed current sinking capability of the programmable resistive memory element; and comparing, with a plurality of differential amplifiers a first voltage input, taken at a second node of the data leg, with a second voltage input; wherein the second voltage input for each differential amplifier comprises different reference voltages with respect to one another so as to enable each differential amplifier to detect a different resistance threshold, thereby determining a specific resistance state of the programmable resistive memory element.

BRIEF DESCRIPTION OF THE DRAWINGS

Referring to the exemplary drawings wherein like elements are numbered alike in the several Figures.

DETAILED DESCRIPTION

Disclosed herein is a method and associated apparatus for implementing an improved sensing technique for multi-bit programmable resistive memory devices. Although the exemplary embodiments described herein are presented in the context of PCRAM devices, it will readily be appreciated that the principles are equally applicable to other types of resistive memory devices including, but not limited to: flash memory, magnetoresistive random access memory (MRAM), ferroelectric random access memory (FRAM), and nanotube devices. Briefly stated, a sense amplifier (SA) circuit is configured to simultaneously or concurrently read all possible states of a multi-bit storage element, such as a PCM element (e.g., having a variable resistance from about 1 kΩ to about 10 MΩ) that is selectively coupled between a bit line (BL) node and ground.

The voltage at a node in a data leg of the sense amplifier circuit is clamped, and thus a known current is applied through the PCM element coupled to the data leg. The output of a plurality of individual differential sense amplifiers, which are each coupled to both the data leg sets to a specific state depending on whether a first input voltage of the sense amplifier (coupled to the data leg) is greater or less than a second input voltage of the sense amplifier. In at least one embodiment, the second voltage is a clamped voltage in an associated reference leg. The current in the data leg is optionally mirrored to each of the plurality reference legs at various levels of gain (e.g., 1×, 10×, 100×). In other embodiments, the second voltage may be a specific reference voltage provided by a voltage divider. Moreover, while in the exemplary embodiments discussed herein, there are three sense amplifiers used so as to detect four discrete resistance states for the memory element, it will be appreciated that a different number of reference legs and sense amplifiers can also be used. For example, to increase the resolution and memory density, a larger number of reference legs and sense amplifiers are used.

Figure 1:
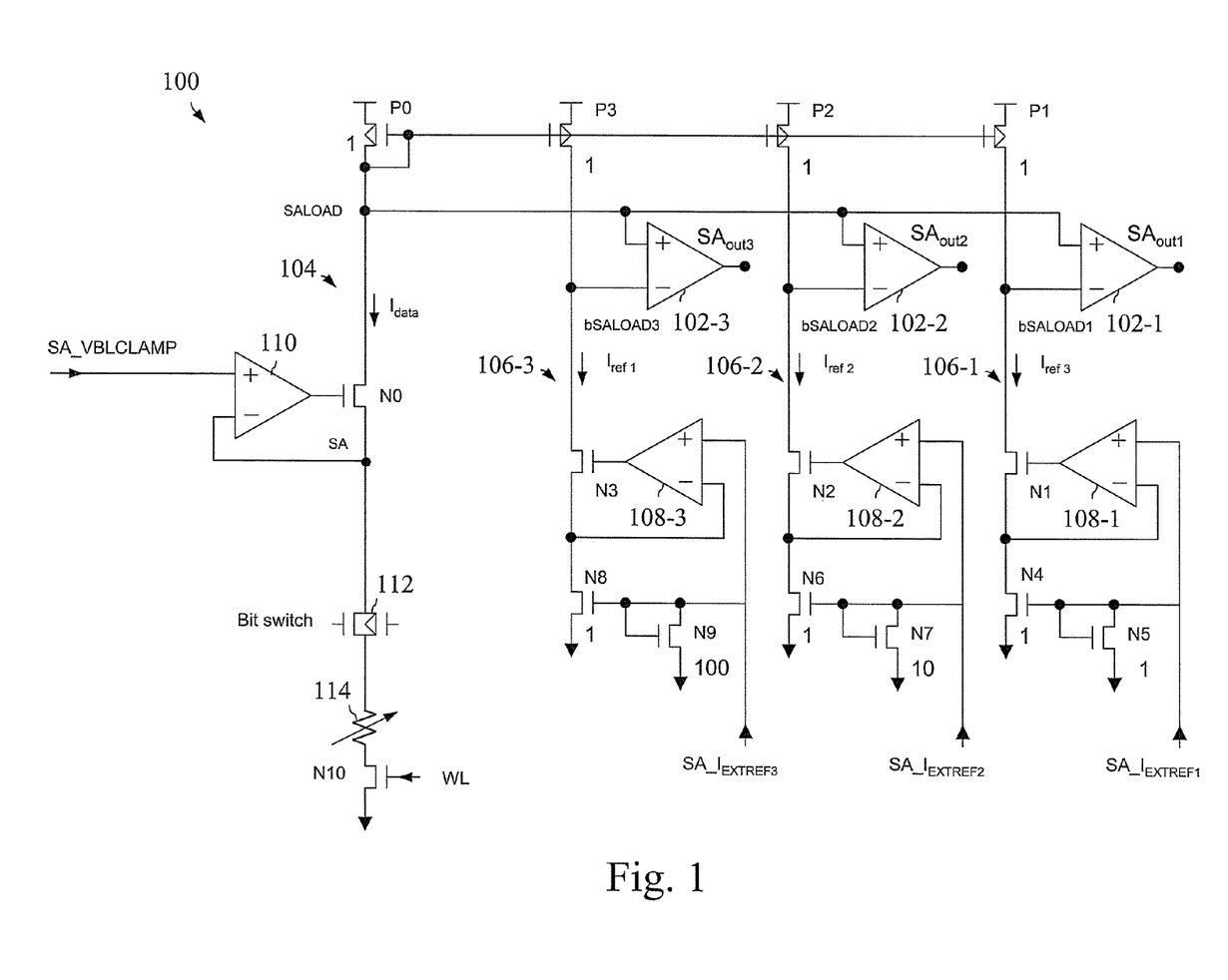
FIG. 1 is a schematic diagram of an apparatus for sensing the data state of a multiple level, programmable resistive memory device, in accordance with an exemplary embodiment of the invention.

Referring initially to FIG. 1, there is shown a schematic diagram of a precision sense amplifier circuit 100 configured to accurately measure the resistance of a multi-bit programmable resistive memory device, such as a PCM element for example. As shown in FIG. 1, the precision sense amplifier circuit 100 includes a plurality (e.g., 3) of differential sense amplifiers 102-1, 102-2, and 102-3, the non-inverting terminals (+) of which are connected to a data leg 104 (at node SALOAD). In this particular embodiment, the inverting terminals (−) of the differential sense amplifiers 102-1, 102-2, and 102-3 are each connected to a respective set of reference legs 106-1, 106-2, and 106-3 (at nodes bSALOAD1, bSALOAD2, and bSALOAD3, respectively).

As further shown in FIG. 1, the circuit 100 also includes current mirrors within each reference leg, in order to mirror currents from an external source ($SA\_I_{EXTREF1}$, $SA\_I_{EXTREF2}$, $SA\_I_{EXTREF3}$). The current mirrors (N4/N5, N6/N7, and N8/N9) are set to provide gains of different values within the three reference legs (e.g., 1×, 10×, 100×). In addition, each of the reference legs 106-1, 106-2, and 106-3 include an enhanced output impedance stage (NFET N1/op amp 108-1, NFET N2/op amp 108-2, NFET N3/op amp 108-3) for tightly controlling the magnitude of reference current and to clamp the voltages in the respective reference legs. A PFET current mirror (P0, in combination with P1, P2 and P3) is used for mirroring the data leg current $I_{data}$ into the reference legs so as to provide precise reference currents ($I_{ref1}$, $I_{ref2}$, $I_{ref3}$). It will be noted that in FIG. 1, exemplary relative conductive strengths of PFETs are depicted with respect to one another, and exemplary relative conductive strengths of NFETs are also depicted with respect to one another.

As is the case with the reference legs, the data leg 104 of the circuit 100 includes a clamping device having a source follower N0 with op amp 110 feedback to clamp the voltage at node "SA" in the data leg, as determined by the input voltage signal SA_VBLCLAMP. A bit switch 112 is used for selectively coupling the data leg 104 to a PCM element 114 at the clamped voltage, and an NFET N10 is controlled by a wordline (WL) signal for selectively coupling the PCM element 114 to ground to allow data current to flow therethrough. The voltage clamping in the data leg 104 provides at least two advantages. First, the PCM element 114 may be in advertently written if the applied read voltage is too high. Thus, the voltage at node SA is clamped at a low enough value such that the state of the cell will remain undisturbed as it is read. Second, the sensing is much more accurate and precise where the read voltage across the PCM element 114 is fixed. A fixed voltage across the PCM element 114 further allows for accurately mirroring the data leg current to the reference leg in this embodiment.

In operation, each differential sense amplifier is set to detect three different resistance thresholds, with sense amplifier 102-1 detecting PCE resistance in the lowest range, sense amplifier 102-2 detecting PCE resistance in a mid resistance range, and sense amplifier 102-3 detecting PCE resistance in the highest range. In the exemplary embodiment depicted, the resistance ranges are separated by about an order of magnitude from one another. Depending upon actual resistance state of the PCM element 114, one of the following thermometric combinations will result: none of the sense amplifier outputs will be high (a first resistance state), only sense amplifier 102-1 output will be high (a second resistance state), both sense amplifier 102-1 and 102-2 outputs will be high (a third resistance state), or each of the sense amplifier outputs 102-1, 102-2 and 102-3 will be high (a fourth resistance state). As described hereinafter, processing logic may be used in conjunction with the outputs of each of the differential sense amplifiers 102-1, 102-2 and 102-3 in order to decode three outputs into a (for example) four-bit signal, the active one of which would represent the specific resistance state of the PCM element.

Figure 2:
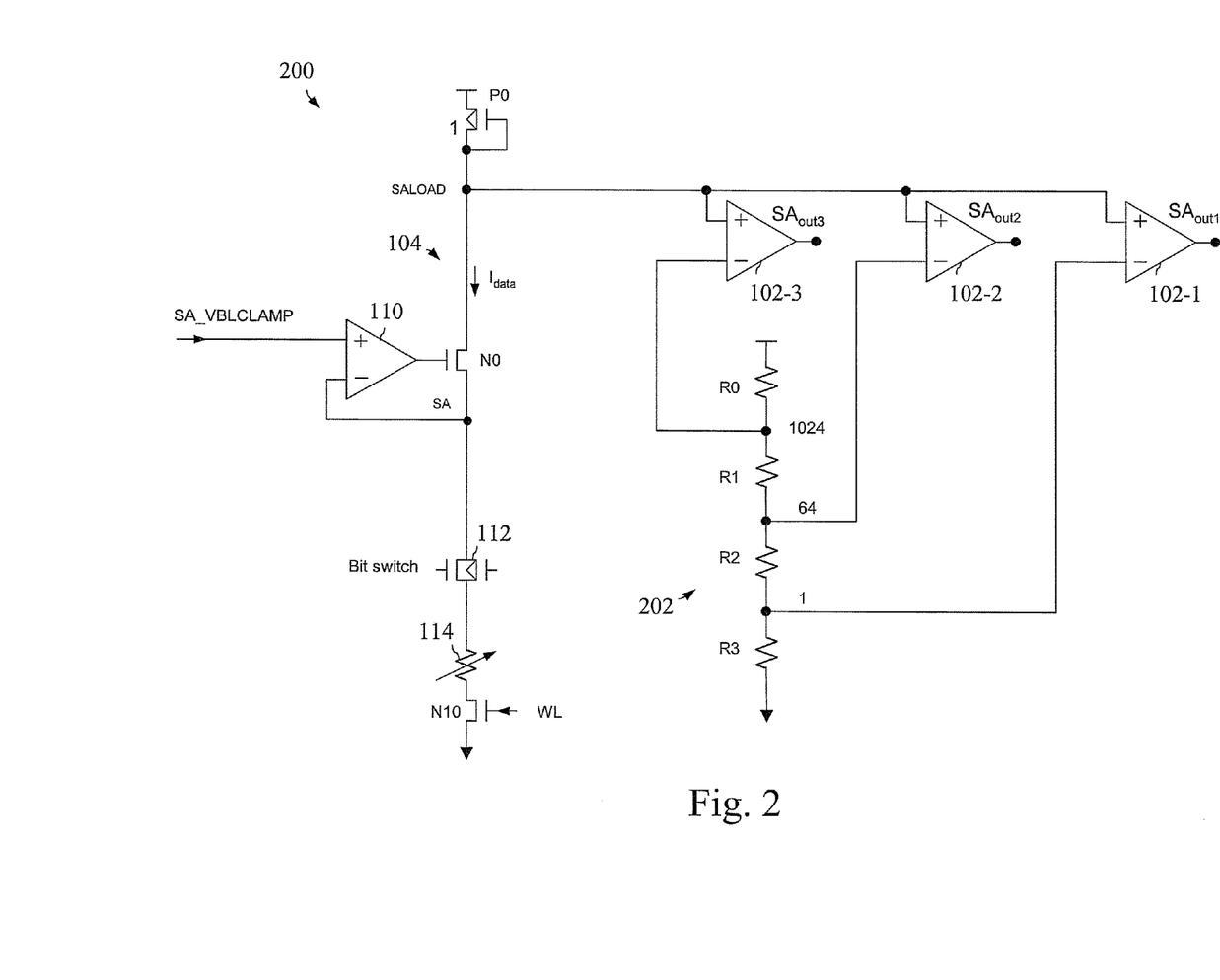
FIG. 2 is a schematic diagram of an apparatus for sensing the data state of a multiple level, programmable resistive memory device, in accordance with an alternative embodiment of the invention.

Referring now to FIG. 2, there is shown a schematic diagram of a precision sense amplifier circuit 200 configured to accurately measure the resistance of a multi-bit programmable resistance device, in accordance with an alternative embodiment of the invention. In lieu of a plurality of reference legs, the inputs of the inverting (−) terminals of the differential sense amplifiers 102-1, 102-2 and 102-3 are instead coupled to output stages of a voltage divider network 202, including resistors R0, R1, R2 and R3. The data leg configuration and inputs to the inverting (+) terminals of the differential sense amplifiers 102-1, 102-2 and 102-3 are the same as in the first embodiment shown in FIG. 1.

The voltage divider network 202 may be configured with as many outputs as there are differential amplifiers (e.g., 3), with each output providing a unique reference voltage input. The specific divider output values are designed to provide an input reference voltage at which each differential amplifier will toggle for a desired resistance value. In an exemplary embodiment, the reference voltages may be determined by circuit simulation as the voltage set at node SALOAD by the active NFET clamp N0 and PFET load P0 devices are nonlinear with respect to the resistance load at the SA node.

The data leg precharge current is set to, for example, SA_VBLCLAMP/(2×largest measurable resistance of the PCM element 114). For example 0.4 V/(2×1 MΩ)=0.2 μA. This sets the SALOAD node initial voltage above the reference voltage for the highest resistor value to be measured. When the precharge period ends and the PCM element 114 is connected to the SA node via the bit switch 112, the voltage at SALOAD will fall, crossing the reference value for a given differential amplifier and triggering its output.

With respect to the embodiment of FIG. 1, the embodiment of FIG. 2 offers a performance advantage over a multiple reference current leg configuration in that because the reference voltage is fixed, no time is needed for the bSALOAD node (FIG. 1) to reach its operating point once the PCM element is connected to the data leg. Here, the reference voltages at the differential amplifiers are independent of the voltage at SALOAD. Furthermore, the precharge voltage of SALOAD is set just above the operating voltage of the largest resistance that will be measured. For lower measured resistances the voltage at SALOAD has to move lower, however this occurs more rapidly with decreasing resistor size since the load current is increasing proportionally. In an exemplary embodiment, PCM state resistances from about 1 kΩ to about 1 MΩ (increasing by a factor of 2 between each step) may be measured, using constant reference voltages of about 880 mV, 1.23 V, and 1.41 V for a 1 kΩ, 64 kΩ, and 1 MΩ resistor, respectively.

Figure 3:
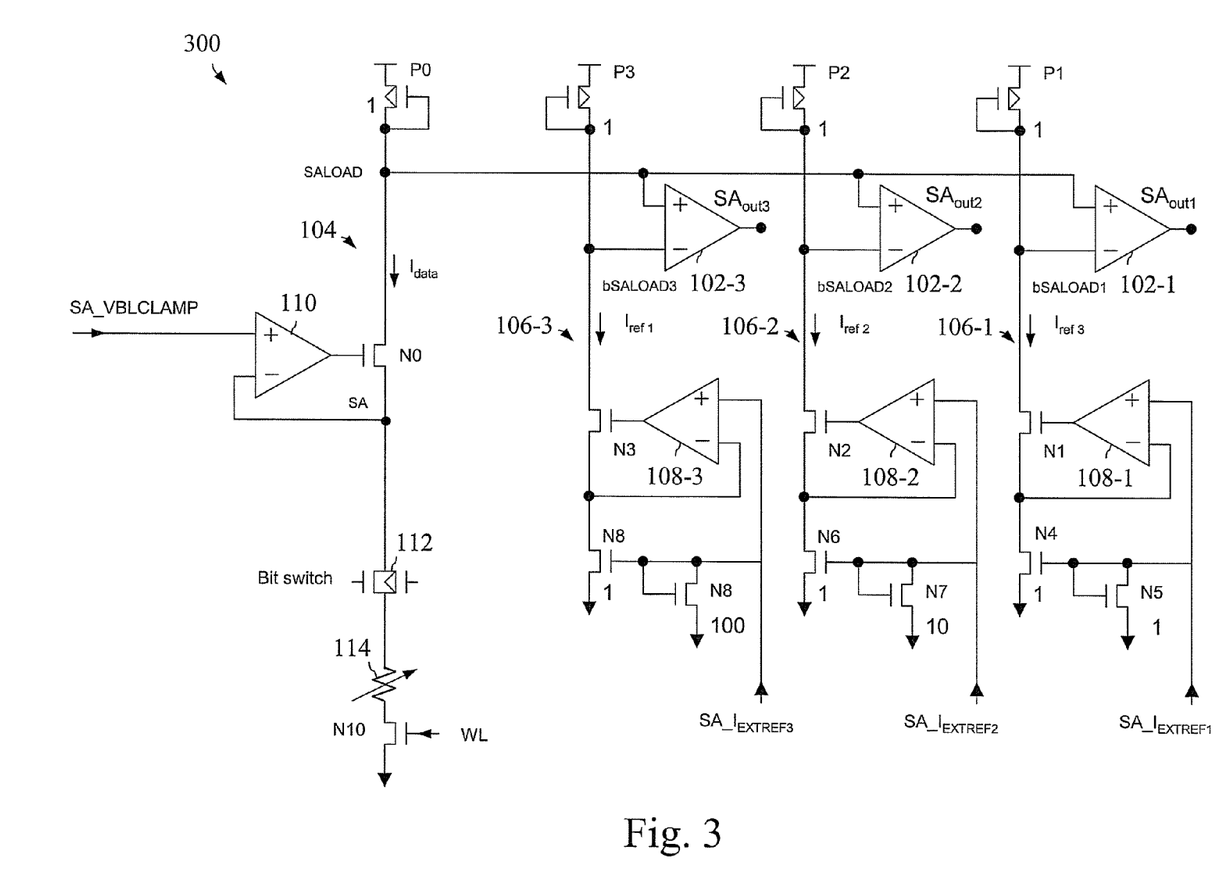
FIG. 3 is a schematic diagram of an apparatus for sensing the data state of a multiple level, programmable resistive memory device, in accordance with an alternative embodiment of the invention.

Referring next to FIG. 3, there is shown a schematic diagram of a precision sense amplifier circuit 300 configured to accurately measure the resistance of a multi-bit programmable resistance device, in accordance with still an alternative embodiment of the invention. The circuit 300 may be characterized as a design tradeoff between the embodiments of FIGS. 1 and 2. In particular, circuit 300 utilizes the current based reference legs 106-1, 106-2, and 106-3 as in the first embodiment, however the PFET load devices P1, P2 and P3 are arranged a diode configuration. Consequently, like the voltage divider approach of FIG. 2, the reference input voltages to the differential amplifiers 102-1, 102-2, and 102-3 are fixed. Thus, the AC performance is much faster with respect to the data leg current mirroring approach of FIG. 1.

Moreover, the resistance value at which each differential amplifier operates may be adjusted since each reference is based on the external V/I input (as opposed to the embodiment of FIG. 2, where the tap points are fixed). Also, in comparison the embodiment of FIG. 2, the embodiment of FIG. 3 offers improvement with respect to voltage regulation. On the other hand, while the AC performance of FIG. 3 is faster than the embodiment of FIG. 1 due the absence of current mirroring from the data leg, the trade off is slightly decreased accuracy.

Figure 4:
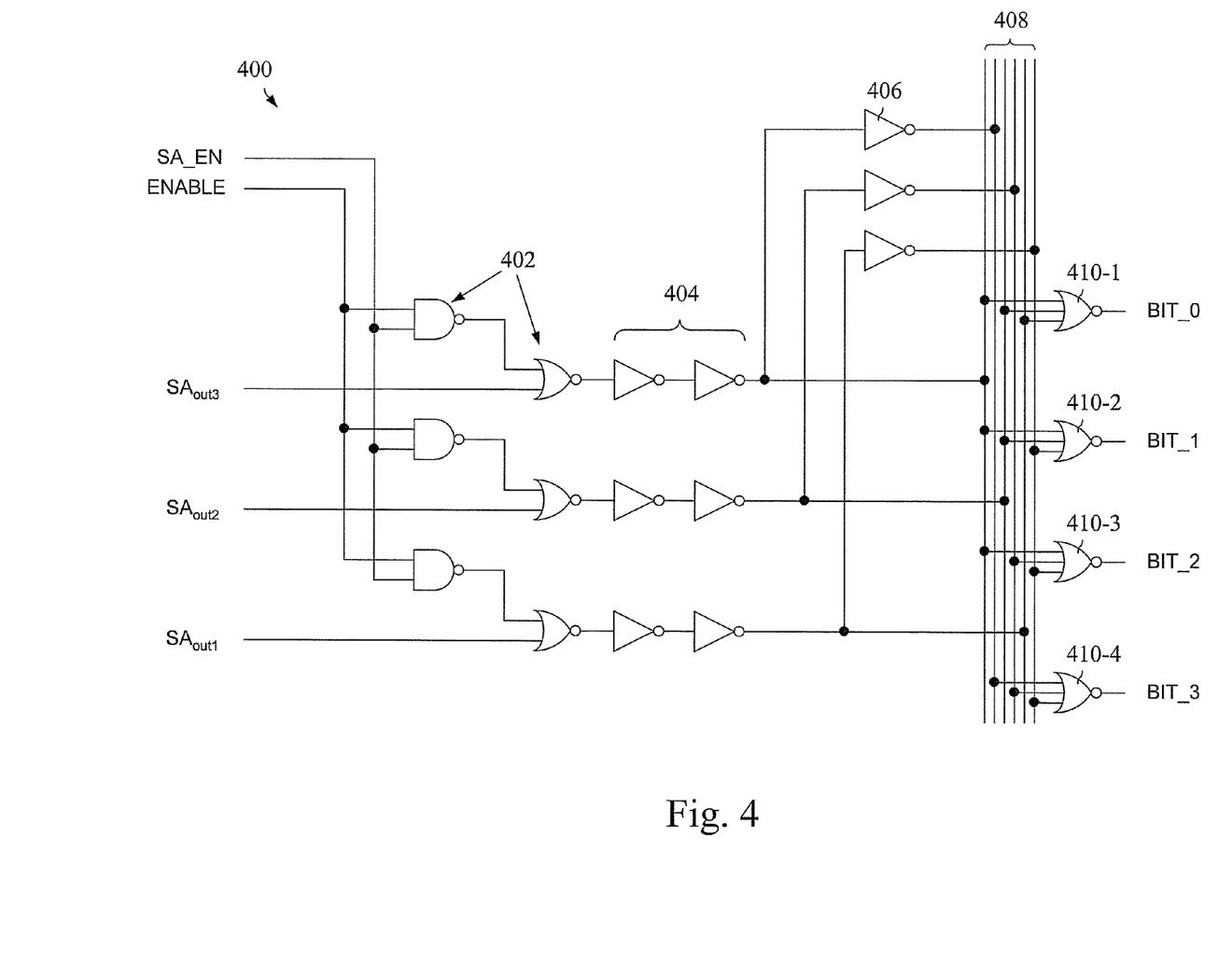
FIG. 4 is a schematic diagram of output processing logic that may be used in conjunction with the outputs of each of the differential amplifiers of the embodiments of FIGS. 1-3, and configured to decode the data state stored in the programmable resistive memory element.

Finally, FIG. 4 is a schematic diagram of output processing logic 400 that may be used in conjunction with the outputs of each of the differential amplifiers of any of the embodiments of FIGS. 1-3, and configured to decode the data state stored in the programmable resistive memory element. The sense amplifier output signals $SA_{out1}$, $SA_{out2}$, $SA_{out3}$ from the differential amplifiers are gated by NAND/NOR gating logic 402, upon logic high activation of both a sense amplifier enable signal (SA_EN) and a global enable signal (ENABLE). The gated sense amplifier output signals are passed through a buffer stage 404 and (along with associated complement versions thereof using inverters 406) are coupled to a signal bus 408. A plurality of 3-input NOR gates 410-1, 410-2, 410-3, 410-4 (e.g., 4 NOR gates for a 4-bit state PCE) is coupled to the signal bus, and in a manner such that the inputs thereof are configured to cause only one of the NOR gate outputs to be activated during a sense operation. More specifically, the output BIT_0 of NOR gate 410-1 is high when none of the three amplifier outputs are high; the output BIT_1 of NOR gate 410-2 is high when the first of the three amplifier outputs are high; the output BIT_2 of NOR gate 410-3 is high when the first and second of the three amplifier outputs are high; and the output BIT_3 of NOR gate 410-4 is high when all three amplifier outputs are high.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for sensing the data state of a multiple level, programmable resistive memory device, comprising:
    an active clamping device connected to a data leg that is selectively coupled a programmable resistive memory element, the active clamping device configured to clamp a fixed voltage, at a first node of the data leg, across the programmable resistive memory element, thereby establishing a fixed current sinking capability thereof; and
    a plurality of differential amplifiers, each of the plurality of differential amplifiers configured to compare a first voltage input, taken at a second node of the data leg, with a second voltage input;
    wherein the second voltage input for each differential amplifier comprises different reference voltages with respect to one another so as to enable each differential amplifier to detect a different resistance threshold, thereby determining a specific resistance state of the programmable resistive memory element;
    a set of reference legs, each associated with one of the differential amplifiers, each reference leg configured to conduct a reference current therethrough, wherein the reference voltage for a given differential amplifier is taken a node in the specific reference leg associated therewith;
    each reference leg further including an adjustable input current source associated therewith, wherein reference currents in each of the reference legs are configured to have different gains with respect to the input current source; and
    each reference leg further including an individual output impedance stage configured for precise control of the reference current therein.

2. The apparatus of claim 1, wherein:
    a first resistance state of the programmable resistive memory element is determined whenever no outputs of any of the differential amplifiers are triggered high during a read operation of the programmable resistive memory element;
    a second resistance state of the programmable resistive memory element is determined whenever an output of only a first of the differential amplifiers is triggered high during the read operation of the programmable resistive memory element;
    a third resistance state of the programmable resistive memory element is determined whenever outputs of only the first and a second of the differential amplifiers are triggered high during the read operation of the programmable resistive memory element; and
    a fourth resistance state of the programmable resistive memory element is determined whenever outputs of the first, second and a third of the differential amplifiers are triggered high during the read operation of the programmable resistive memory element.

3. The apparatus of claim 1, further comprising a current mirror configured to mirror data leg current to each of the reference legs for enhanced precision of the reference currents.

4. The apparatus of claim 1, wherein the reference voltages for each of the differential amplifiers remain fixed during a read operation of the programmable resistive memory element.

5. The apparatus of claim 1, wherein the active clamping device is configured to hold the voltage at the first node of the data leg at a sufficiently low value so as to prevent disturbing the state of the programmable resistive memory element as it is read.

6. The apparatus of claim 1, wherein the different resistance thresholds detectable by the plurality of differential amplifiers are separated from one another by about an order of magnitude.

7. The apparatus of claim 1, further comprising output processing logic coupled to outputs of each of the differential amplifiers, the output processing logic configured to decode the data state stored in the programmable resistive memory element.

8. An apparatus for sensing the data state of a multiple level, programmable resistive memory device, comprising:
    an active clamping device connected to a data leg that is selectively coupled a programmable resistive memory element, the active clamping device configured to clamp fixed voltage, at a first node of the data leg, across the programmable resistive memory element, thereby establishing a fixed current sinking capability thereof;
    a plurality differential amplifiers, each of the plurality of differential amplifiers configured to compare a first voltage input, taken at a second node of the data leg, with a second voltage input;
    wherein the second voltage input for each differential amplifier comprises different reference voltages with respect to one another so as to enable each differential amplifier to detect a different resistance threshold, thereby determining a specific resistance state of the programmable resistive memory element; and
    output processing logic coupled to outputs of each of the differential amplifiers, the output processing logic configured to decode the data state stored in the programmable resistive memory element, wherein the output processing logic further comprises:
    gating logic configured to selectively pass outputs of the differential sense amplifier;
    a buffer stage coupled to the gating logic;
    a set of inverters configured to generate complement signals of the buffered differential sense amplifier output signals; and
    a plurality of NOR gates, one for each of the resistance states of the programmable resistive memory element, with each NOR gate having a set of inputs coupled to various combinations of the buffered differential sense amplifier output signals and the complements thereof such that only one of the NOR gates is active high following a read operation of the programmable resistive memory element.

9. A method of sensing the data state of a multiple level, programmable resistive memory device, the method comprising:
    clamping, with an active clamping device, a fixed voltage at a first node of a data leg that is selectively coupled to a programmable resistive memory element, the active clamping device thereby establishing a fixed current sinking capability of the programmable resistive memory element;
    comparing, with a plurality of differential amplifiers a first voltage input, taken at a second node of the data leg, with a second voltage input;
    wherein the second voltage input for each differential amplifier comprises different reference voltages with respect to one another so as to enable each differential amplifier to detect a different resistance threshold, thereby determining a specific resistance state of the programmable resistive memory element; and utilizing a set of reference legs, each associated with one of the differential amplifiers, to conduct a reference current therethrough, wherein the reference voltage for a given differential amplifier is taken from a node in the specific reference leg associated therewith;

each reference leg further including an adjustable input current source associated therewith, wherein reference currents in each of the reference legs are configured to have different gains with respect to the input current source; and each reference leg further including an individual output impedance stage configured for precise control of the reference current therein.

10. The method of claim 9, wherein:

a first resistance state of the programmable resistive memory element is determined whenever no outputs of any of the differential amplifiers are triggered high during a read operation of the programmable resistive memory element;

a second resistance state of the programmable resistive memory element is determined whenever an output of only a first of the differential amplifiers is triggered high during the read operation of the programmable resistive memory element;

a third resistance state of the programmable resistive memory element is determined whenever outputs of only the first and a second of the differential amplifiers are triggered high during the read operation of the programmable resistive memory element; and a fourth resistance state of the programmable resistive memory element is determined whenever outputs of the first, second and a third of the differential amplifiers are triggered high during the read operation of the programmable resistive memory element.

11. The method of claim 9, further comprising mirroring, with a current mirror, data leg current to each of the reference legs for enhanced precision of the reference currents.

12. The method of claim 9, wherein the reference voltages for each of the differential amplifiers remain fixed during a read operation of the programmable resistive memory element.

13. The method of claim 9, wherein the active clamping device is configured to hold the voltage at the first node of the data leg at a sufficiently low value so as to prevent disturbing the state of the programmable resistive memory element as it is read.

14. The method of claim 9, wherein the different resistance thresholds detectable by the plurality of differential amplifiers are separated from one another by about an order of magnitude.

15. The method of claim 9, further comprising decoding the data state stored in the programmable resistive memory element with output processing logic coupled to outputs of each of the differential amplifiers.

16. A method of sensing the data state of a multiple level, programmable resistive memory device, the method comprising:

clamping, with an active clamping device, a fixed voltage at a first node of a data leg that is selectively coupled to a programmable resistive memory element, the active clamping device thereby establishing a fixed current sinking capability of the programmable resistive memory element;

comparing, with a plurality of differential amplifiers a first voltage input, taken at a second node of the data leg, with a second voltage input;

wherein the second voltage input for each differential amplifier comprises different reference voltages with respect to one another so as to enable each differential amplifier to detect a different resistance threshold, thereby determining a specific resistance state of the programmable resistive memory element; and decoding the data state stored in the programmable resistive memory element with output processing logic coupled to outputs of each of the differential amplifiers, wherein the output processing logic further comprises:

gating logic configured to selectively pass outputs of the differential sense amplifier;

a buffer stage coupled to the gating logic;

a set of inverters configured to generate complement signals of the buffered differential sense amplifier output signals; and a plurality of NOR gates, one for each of the resistance states of the programmable resistive memory element, with each NOR gate having a set of inputs coupled to various combinations of the buffered differential sense amplifier output signals and the complements thereof such that only one of the NOR gates is active high following a read operation of the programmable resistive memory element.

* * * * *